United States Patent [19]

Masuko et al.

[11] Patent Number: 5,023,447
[45] Date of Patent: Jun. 11, 1991

[54] PHOTO-SEMICONDUCTOR MODULE EMPLOYING SEMI-SPHERICAL LENS TO ENHANCE DETECTION

[75] Inventors: Takayuki Masuko, Koganei; Akira Okamoto, Higashikurume; Kaoru Moriya, Kawasaki; Koji Okamura; Tadao Arima, both of Tochigi, all of Japan

[73] Assignee: Fujitsu Limited, Kanagawa, Japan

[21] Appl. No.: 539,348

[22] Filed: Jun. 18, 1990

[30] Foreign Application Priority Data

Jun. 19, 1989 [JP] Japan .................................. 1-154660
Mar. 14, 1990 [JP] Japan .................................. 2-63271

[51] Int. Cl.⁵ ............................................. H01J 5/16
[52] U.S. Cl. ............................. 250/227.24; 350/96.18
[58] Field of Search .......................... 250/227.24, 239; 350/96.15, 96.17, 96.18, 96.20

[56] References Cited

U.S. PATENT DOCUMENTS

| | | | |
|---|---|---|---|
| 4,611,884 | 9/1986 | Roberts | 250/227.24 |
| 4,611,886 | 9/1986 | Cline et al. | 250/227.24 |
| 4,732,446 | 3/1988 | Gipson et al. | 350/96.18 |
| 4,756,590 | 7/1988 | Forrest et al. | 350/96.15 |
| 4,854,659 | 8/1989 | Hamerslag et al. | 250/227.24 |
| 4,983,009 | 1/1981 | Musk | 350/96.18 |

FOREIGN PATENT DOCUMENTS

| | | |
|---|---|---|
| 2581768 | 11/1986 | France . |
| 5925282 | 2/1982 | Japan . |
| 57-198420 | 12/1982 | Japan . |
| 58-103187 | 6/1983 | Japan . |
| 63-90866 | 4/1988 | Japan . |
| 0104882 | 4/1984 | United Kingdom . |
| 2162335 | 1/1986 | United Kingdom . |

Primary Examiner—David C. Nelms
Assistant Examiner—Stephone Allen
Attorney, Agent, or Firm—Staas & Halsey

[57] ABSTRACT

A photo-semiconductor module is disclosed wherein a reliable airtight condition can be obtained and an operability in assembly can be improved. The photo-semiconductor module comprises a substrate carried in a casing, a photo-semiconductor chip mounted on the substrate, and a support member carried on the substrate and having an inclined face which is inclined by an angle of 45 degrees with respect to a surface of the substrate. A semi-spherical lens is securely mounted on the inclined face of the support member, and an opening formed in a side wall of the casing is sealed airtight by a glass member while an upper portion of the casing is sealed airtight by a lid. When an optical fiber is mounted onto the casing such that an end face thereof may be located in the opening in the side wall of the casing, the optical fiber and the photo-semiconductor chip are optically coupled to each other by way of the semi-spherical lens.

10 Claims, 4 Drawing Sheets

PHOTO-SEMICONDUCTOR MODULE EMPLOYING SEMI-SPHERICAL LENS TO ENHANCE DETECTION

BACKGROUND OF THE INVENTION

This invention relates to a photo-semiconductor module.

When it is attempted to put a photo-semiconductor module into practical use which is constructed by optically coupling a photo-semiconductor device such as a laser diode (LD) or a photodiode (PD) to an optical fiber, since a photo-semiconductor device or some other part is sometimes deteriorated by an influence of an ambient humidity or the like, such construction is normally employed wherein the photo-semiconductor device and so forth are accommodated in an airtight sealed condition in a casing. Then, in the construction, it is necessary to optically couple such photo-semiconductor device to an optical fiber communicating with the outside of the casing such that the airtight condition of the inside of the casing may not be damaged. Thus, photo-semiconductor modules are demanded which assure a high airtight condition and are easy to produce.

Figure 1:
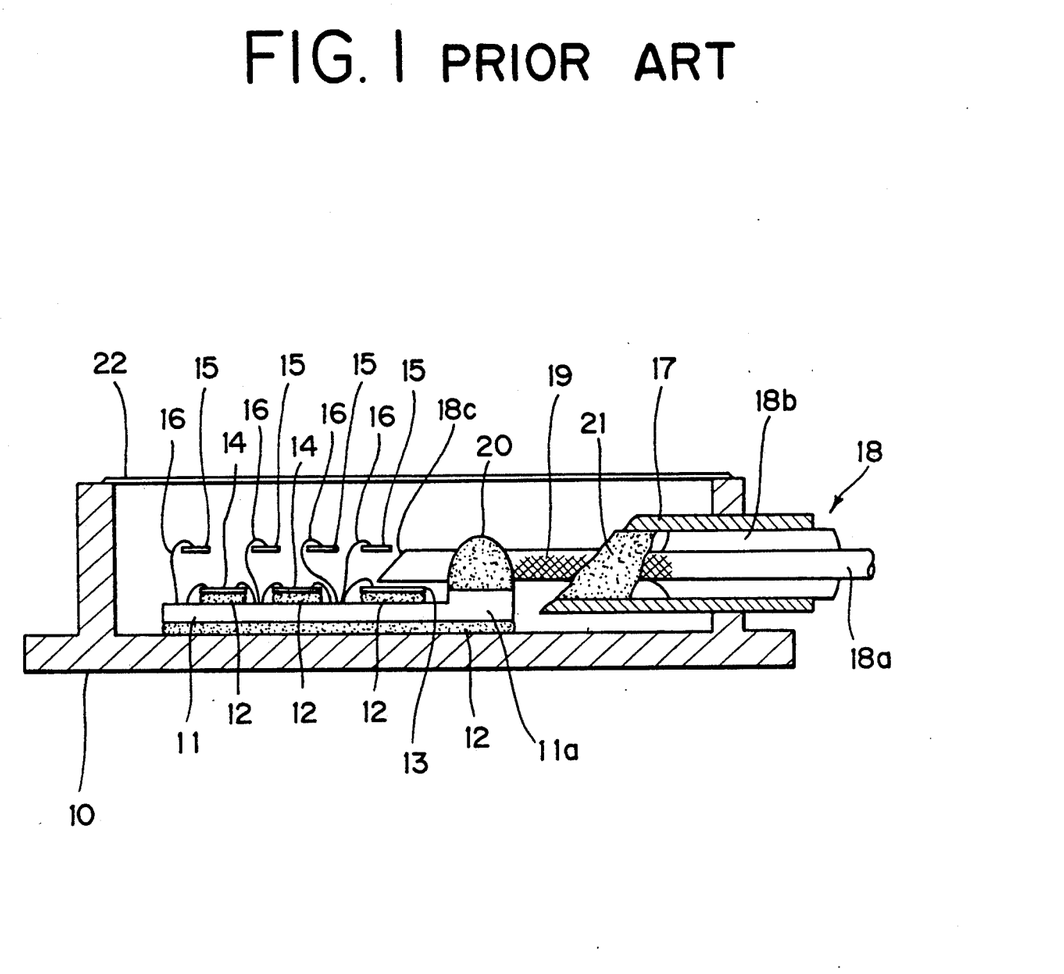
FIG. 1 is a sectional view of an exemplary conventional photo-semiconductor module.

Construction of an exemplary one of conventional photo-semiconductor modules will first be described with reference to FIG. 1.

A ceramic substrate 11 having a platform 11a at a portion thereof is secured to an inner face of a bottom wall of a casing 10 by means of solder 12. A PD (photodiode) chip 13 is secured by solder 12 to an upper face of the ceramic substrate 11 with a photodetecting surface thereof directed upwardly. Various other electronic parts 14 such as ICs and chip capacitors are also secured to the upper face of the ceramic substrate 11 by means of solder 12. Terminals 15 for supplying a power source to the parts 14 and for extracting a signal produced by photoelectric conversion at the PD chip 13 are secured to a side wall of the casing 10 such that an end of each of them may be positioned in the inside of the casing 10 and the other end may be positioned outside the casing 10. The PD chip 13 and the parts 14 on the ceramic substrate 11 are individually connected to the terminals 15 by way of bonding wires 16.

A tubular member 17 extends through another side wall of the casing 10, and an optical fiber 18 is inserted in the tubular member 17. The optical fiber 18 includes a bare fiber 18a and a nylon coating 18b coated on an outer periphery of the bare fiber 18a. The nylon coating 18b is removed at an end portion of the optical fiber 18, and gold 19 is deposited on a surface of the thus exposed bare fiber 18a by vapor deposition. The bare fiber 18a is polished obliquely at an end 18c thereof as shown in FIG. 1 and is secured at a side portion (at which the gold 19 is deposited) thereof to the platform 11a of the ceramic substrate 11 by solder 20 such that the end 18c thereof may be positioned above the PD chip 13. The bare fiber 18a is further secured to an inner end portion of the tubular member 17 by means of solder 21. The inner portion of the tubular member 17 is thus sealed in an airtight condition by the solder 21. A lid 22 seals an upper portion of the casing 10 in an airtight condition. The photo-semiconductor module is thus designed so as to prevent possible deterioration of the PD chip 13 and so forth with such construction as described above.

However, according to the conventional photo-semiconductor module of the construction described above, when the optical fiber is inserted into the tubular member and secured in position by soldering, the end portion of the bare fiber is likely to touch with the PD chip or other harts to cause damage thereto or damage to the PD chip. Since the gold is deposited on the side portion of the bare fiber by vapor deposition and the end portion of the bare fiber is necessarily be polished obliquely, if such damage occurs, then vapor deposition or polishing must be performed again. Accordingly, there is a problem that a comparatively large number of man-hours are required for such operation.

Further, an operation for the coupling between the optical fiber and the photo-semiconductor device and another operation for the airtight sealing must be performed simultaneously. However, since the two operations require high precision, there is another problem that an airtight sealed condition may not be achieved with certainty.

SUMMARY OF THE INVENTION

Accordingly, it is an object of the present invention to provide a photo-semiconductor module wherein a reliable airtight condition can be attained and the operability in assembly can be improved overcoming the problems of the prior art described above.

In accordance with an aspect of the present invention, there is provided a photo-semiconductor module which comprises a casing having a bottom wall and a side wall which has an opening formed therein, a substrate carried on the bottom wall of the casing, a photo-semiconductor chip mounted on the substrate, a support member carried on the substrate and having an inclined face which is inclined by an angle of 45 degrees with respect to a surface of the substrate, a semi-spherical lens having a polished face passing the center of the sphere thereof and securely mounted at the polished face thereof on the inclined face of the support member above the photo-semiconductor chip, a glass member securely mounted on the side wall of the casing in such a manner as to close up the opening, a lid mounted on the casing for sealing the inside of the casing in an airtight condition, and an optical fiber mounted on the casing such that an end face thereof may be located in or in the neighborhood of the opening.

In accordance with another aspect of the present invention, there is provided a photo-semiconductor module which comprises a casing having a bottom wall and a side wall which has an opening formed therein, a substrate carried on the bottom wall of the substrate, a photo-semiconductor chip mounted on the substrate, a glass rod inserted in the opening and secured to the side wall of the casing such that an end thereof may extend into the inside of the casing, the glass rod having at the end thereof an inclined face which is inclined by an angle of 45 degrees with respect to the center axis of the glass rod, a lid mounted on the casing for sealing the inside of the casing in an airtight condition, and a fiber assembly mounted on the side wall of the casing such that the optical axis thereof may substantially coincide with the center axis of the glass rod, the fiber assembly including a ferrule in and to which an optical fiber is inserted and secured and a cylindrical member in which the ferrule and a lens are accommodated in a predetermined positional relationship.

The photo-semiconductor modules of the present invention are constituted such that, if the photo-semiconductor device and the electronic parts are accommodated into the inside of the casing and the optical fiber is to the side wall of the casing while the casing is held in a perfectly airtight sealed condition, then the photo-semiconductor device accommodated in the casing and the optical fiber are optically coupled to each other. Due to the construction, an operation of mounting the optical fiber onto the casing to establish an optically coupled condition between the optical fiber and the photo-semiconductor device and another operation for the airtight sealing can be separated perfectly from each other, and accordingly, the reliability in airtight sealing can be improved. Further, since only it is necessary to secure the end portion of the optical fiber at a predetermined location of the casing by means of a holder or the like, such a possible trouble can be eliminated that the end portion of the optical fiber may be damaged or the photo-semiconductor device may be damaged during an operation, and the operability is improved significantly.

In accordance with a further aspect of the present invention, there is provided a photo-semiconductor module which comprises a casing having a bottom wall and a side wall which has an opening formed therein, a substrate carried on the bottom wall of the casing, a photo-semiconductor chip mounted on the substrate, a ferrule inserted in the opening and mounted on the side wall of the casing such that an end thereof may extend into the inside of the casing, the ferrule having a center bore, a lens accommodating chamber formed in a portion thereof adjacent the end contiguously to the center bore, and a hole formed at a lower portion of a side wall thereof which defines the lens accommodating chamber, the ferrule having an optical fiber inserted in and secured to the center bore thereof from the other end side, a semi-spherical lens accommodated in the accommodating chamber, and holding means for holding the semiconductor lens such that a spherical face thereof contacts with an end face of the optical fiber and a polished face thereof which passes the center of the sphere of the semi-spherical lens makes an angle of 45 degrees with respect to the optical fiber.

The above and other objects, features and advantages of the present invention and the manner of realizing them will become more apparent, and the invention itself will best be understood, from a study of the following description and appended claims, with reference had to the attached drawings showing some preferred embodiments of the invention.

DESCRIPTION OF THE PREFERRED EMBODIMENTS

Figure 2:
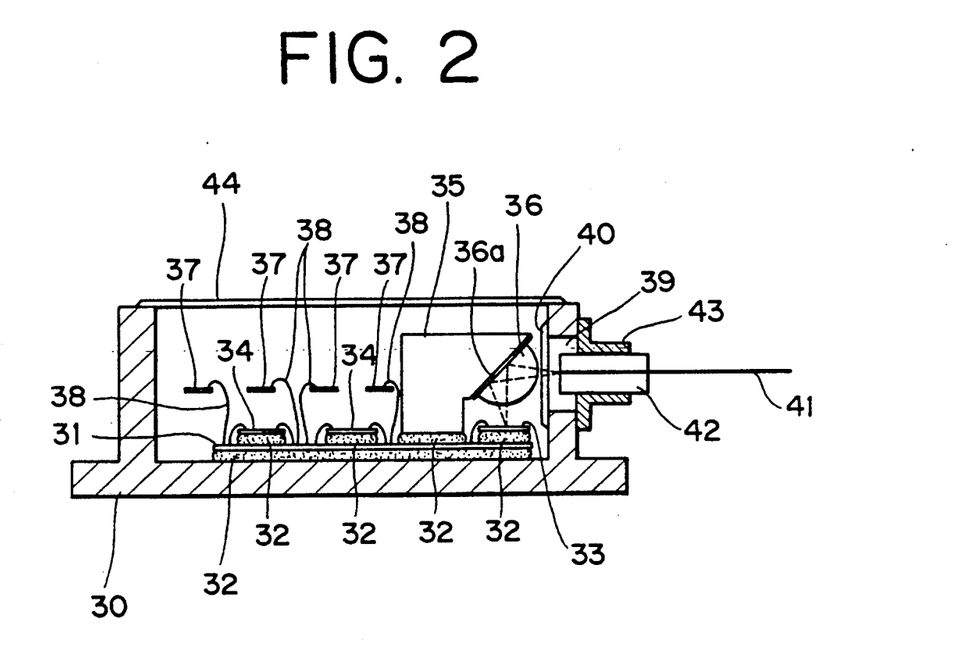
FIG. 2 is a sectional view of a photo-semiconductor module showing a preferred embodiment of the present invention.

Referring first to FIG. 2, a ceramic substrate 31 is secured to an inner face of a bottom wall of a casing 30 by means of solder 32. Preferably, the casing 30 is made of Kovar (Fe-Ni-Co alloy) having a coefficient of thermal expansion substantially equal to that of glass. A photodiode chip (PD chip) 33 is secured to an upper face of the ceramic substrate 31 by means of solder 32 with a photodetecting surface thereof directed upwardly, and various other electronic parts 34 such as ICs and chip capacitors are secured also to the upper surface of the ceramic substrate 31 by means of solder 32.

Figure 3:
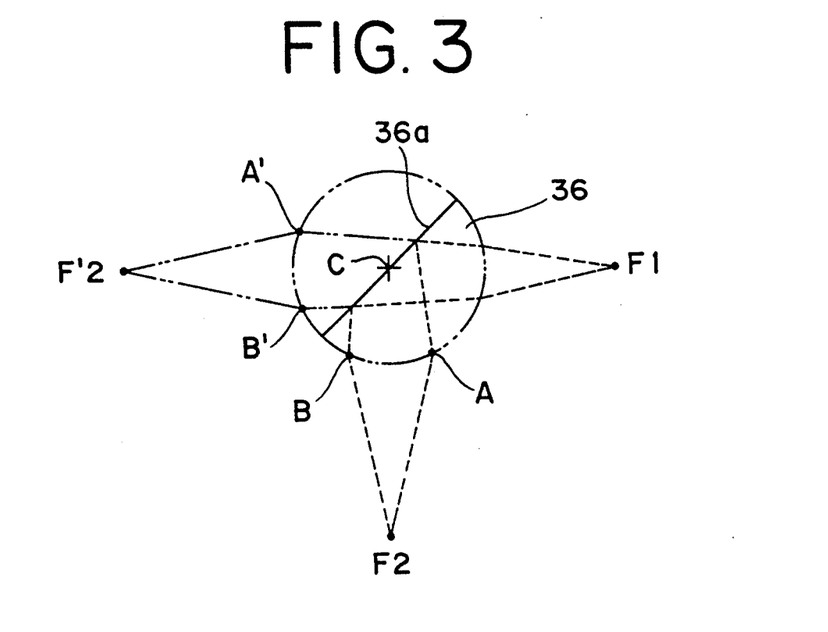
FIG. 3 is a diagrammatic representation showing a semi-spherical lens employed in the photo-semiconductor module shown FIG. 2.

A support arm is further secured to the upper face of the ceramic substrate 31 by means of solder 32. The support arm 35 has an inclined face which is inclined by an angle of 45 degrees with respect to the upper face of the ceramic substrate 31, and a semi-spherical lens 36 is secured to the inclined face of the support arm 35 as seen in FIG. 2. The semi-spherical lens 36 is formed by inserting a spherical lens into a semi-spherical recess formed in a base and then polishing the spherical lens to the center of the sphere thereof. The semi-spherical lens 36 operates in such a manner as illustrated in FIG. 3. Referring to FIG. 3, emergent light from a point $F_1$ is totally reflected by the polished face 36a of the semi-spherical lens 36 and then passes a range between points A and B of the semi-spherical lens 36 whereafter it is focused at another point $F_2$. It is to be noted that, otherwise in the case of a spherical lens, emergent light from the point $F_1$ will pass a range between points A' and B' and be focused at a further point $F_2'$ as indicated by imaginary lines in FIG. 3, and the distance from the spherical center C to the point $F_2'$ is equal to the distance from the spherical center C to the point $F_2$. A reflecting film may be formed on the polished face 36a of the semi-spherical lens 36 to improve the efficiency in total reflection of the semi-spherical lens 36.

Referring back to FIG. 2, terminals 37 for supplying a power source to the electronic parts 34 and for extracting a signal produced by photoelectric conversion at the PD chip 33 are secured to a side wall of the casing 30 such that they may be each positioned at an end thereof in the inside of the casing 30 and at the other end thereof outside the casing 30. The PD chip 33 and the electronic parts 34 on the ceramic substrate 11 are individually connected to the terminals 37 by way of bonding wires 38.

The casing 30 has an opening 39 formed in another side wall thereof, and a glass member or plate 40 of sapphire glass or the like is brazed to an inner face of the side wall adjacent the opening 39 such that the opening 39 may be sealed in an airtight condition by the glass member 40. An optical fiber 41 is inserted in and secured to a small hole formed in a ferrule 42 secured to a holder 43, and the holder 43 is in turn secured to the casing 30 such that emergent light from the optical fiber 41 may be optically coupled to the semi-spherical lens 36. An upper portion of the casing 30 is sealed in an airtight condition by a lid 44.

Thus, emergent light from the optical fiber 41 passes through the glass member 40 secured adjacent the opening 39 and is introduced into the semi-spherical lens 36, whereafter it is totally reflected by the polished face 36a of the semi-spherical lens 36 and is focused upon the PD chip 33.

In the photo-semiconductor module of the embodiment described above, if predetermined electronic parts and so forth are accommodated into the casing 30 and then the optical fiber 41 is secured to the side wall of the casing 30 while maintaining the casing 30 in a perfectly airtight sealed condition, then the PD chip 33 accommodated in the casing 30 and the optical fiber 41 are optically coupled to each other. Due to the construction, since an operation of mounting the optical fiber 41 onto the casing 30 and another operation for the airtight sealing are separated perfectly from each other, the certainty in airtight sealing can be improved. Then, since an end portion of the optical fiber 41 need only be secured at a predetermined location of the casing 30 by way of the holder 43, such a possible trouble that an end portion of the optical fiber 41 is damaged or the PD chip 33 or the like is damaged during an operation can be eliminated, and the operability can be improved significantly.

Figure 4:
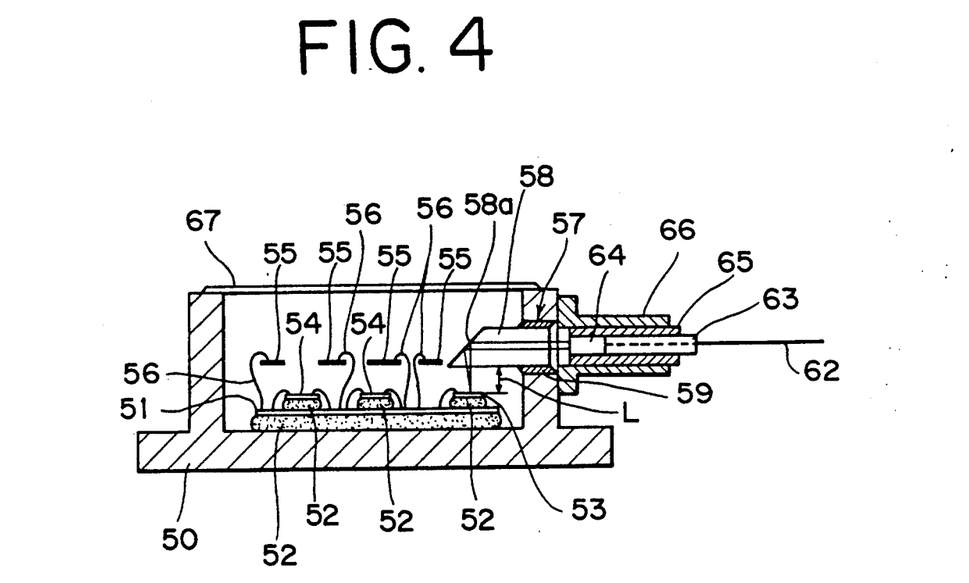
FIG. 4 is a sectional view of a photo-semiconductor module showing another preferred embodiment of the present invention.
Figure 5:
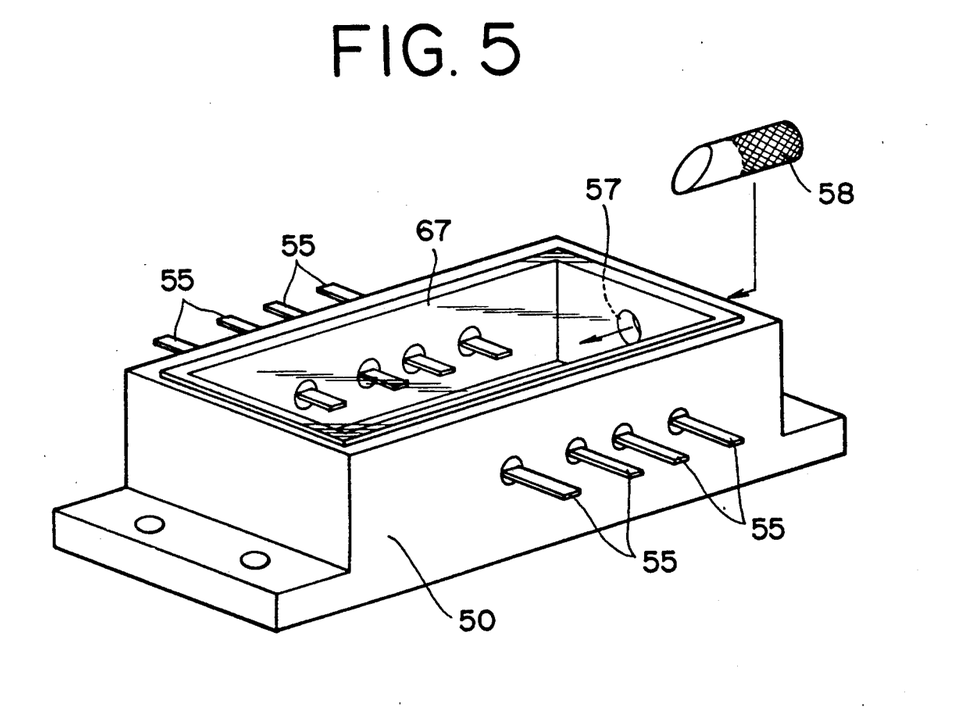
FIG. 5 is a schematic perspective view of the photo-semiconductor module shown in FIG. 4.
Figure 6:
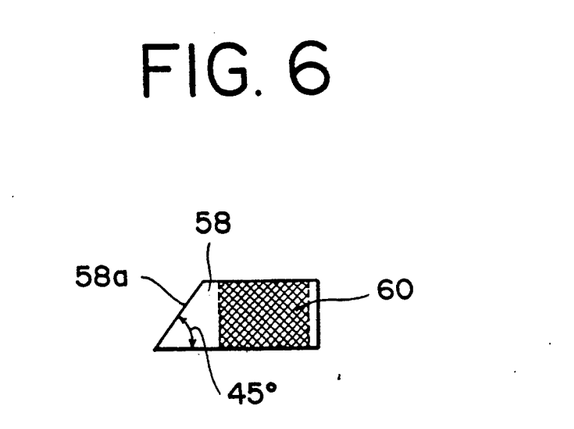
FIG. 6 is a side elevational view of a glass rod employed in the photo-semiconductor module shown in FIG. 4.

Referring now to FIGS. 4 to 6, there is shown a photo-semiconductor module according to another preferred embodiment of the present invention. A ceramic substrate 51 is secured by means of solder 52 to an inner face of a bottom wall of a casing 50 preferably made of Kovar. A PD chip 53 is secured to an upper face of the ceramic substrate 51 by means of solder 52 with a photodetecting surface thereof directed upwardly, and various other electronic parts 54 such as ICs and chip capacitors are also secured to the upper face of ceramic substrate 51 by means of solder 52.

Terminals 55 for supplying a power source to the parts 54 and for extracting a signal produced by photoelectric conversion at the PD chip 53 are secured to a side wall of the casing 50 such that they may be each positioned at an end thereof in the inside of the casing 50 and at the other end thereof outside the casing 50. The PD chip 53 and the parts 54 on the ceramic substrate 51 are individually connected to the terminals 55 by way of bonding wires 56.

The casing 50 has a hole 57 formed in another side wall thereof such that it communicates the outside and the inside of the casing 50 with each other, and a glass rod 58 is inserted in the hole 57. The glass rod 58 is formed by polishing an end face of a cylindrical glass block such that it may be inclined by an angle of 45 degrees with respect to the center axis of the cylindrical glass block as shown in FIG. 6, and gold 60 is deposited on a side face of the glass rod 38 by vapor deposition at a high temperature. Then, the glass rod 58 is secured to the hole 57 of the casing 50 by brazing at a high temperature by means of solder material 59 in such a manner as to seal the hole 57 in an airtight condition.

An optical fiber 62 is inserted in and secured to a small hole formed in a ferrule 63 secured to a pipe member 65 together with a condensing lens 64, and the pipe member 65 is secured to a holder 66 which is in turn secured to the casing 50 adjacent the hole 57. An upper portion of the casing 50 is sealed in an airtight condition by a lid 67.

Thus, emergent light from the optical fiber 62 is condensed by the lens 64 and then introduced into the glass rod 58 secured to the hole 57 of the casing 50. The light is then totally reflected by the polished face 58a of the glass rod 58 and is focused upon the PD chip 53.

In the photo-semiconductor module of the embodiment described above, since a comparatively great distance L can be assured between the glass rod 58 and the PD chip 53, the possibility of such a possible trouble is reduced that the glass rod 58 may be contacted, in an assembling operation, with the PD chip 53 to damage the glass rod 58 or the PD chip 53. Further, since gold can be deposited on the glass rod 58 by vapor deposition at a high temperature and the glass rod 58 can be brazed at a high temperature to the case 50 due to the construction of the photo-semiconductor module, possible imperfection in airtight sealing can be reduced.

Figure 7:
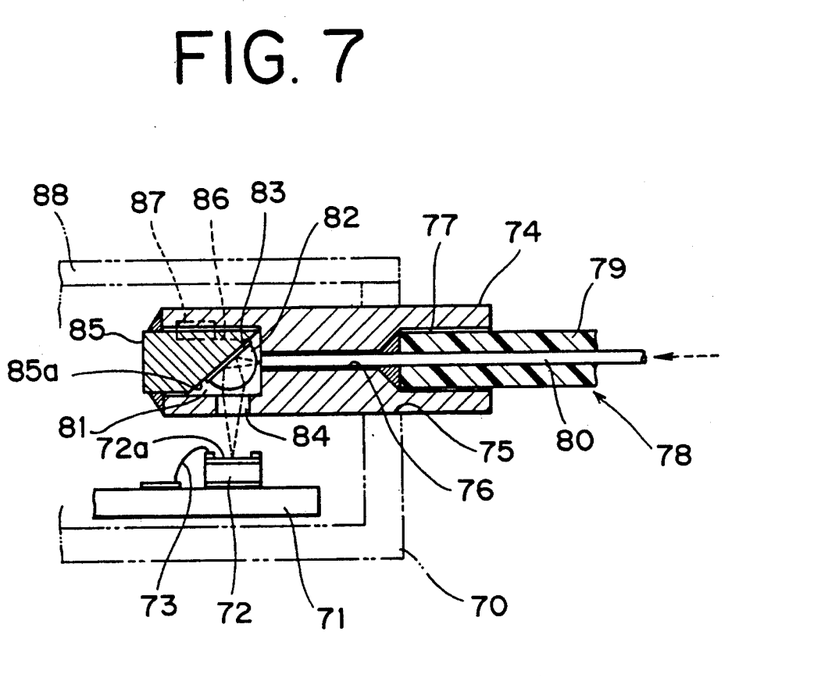
FIG. 7 is a schematic sectional view of a photo-semiconductor module showing a further preferred embodiment of the present invention with a casing indicated in phantom.

Referring now to FIG. 7, there is shown in sectional view a photo-semiconductor module according to a further preferred embodiment of the present invention. A ceramic substrate 71 is secured to an inner face of a bottom wall of a casing 70 preferably made of Kovar. A PD chip 72 is secured to an upper face of the ceramic substrate 71 with a photodetecting surface 72a thereof directed upwardly, and various other electronic parts not shown are also secured to the upper face of ceramic substrate 71. The PD chip 72 has an electrode formed on an entire rear face thereof and is mounted on the ceramic substrate 71 by soldering the electrode to a conductor pattern formed on the ceramic substrate 71. The PD chip 72 has another electrode of a ring-shape formed on a front face thereof, and the ring-shaped electrode is connected by way of a boding wire 73 to another conductor pattern formed on the ceramic substrate 71.

The casing 70 has an opening 75 formed in another side wall thereof, and a ferrule 74 made of, for example, stainless steel is inserted in the opening 75 in parallel to the ceramic substrate 71 and is soldered to the side wall of the casing 70 to secure the ferrule 74 to the casing 70 and seal the portion of the side wall of the casing 70 in an airtight condition.

The ferrule 74 has a center bore 76 formed therein. The center bore 76 has a diameter substantially equal to an outer diameter of a bare fiber 80 of an optical fiber 78 at a portion from which a nylon coating 79 is removed. The ferrule 74 further has a hole 77 formed on an extension line of and contiguously to the center bore 76. The hole 77 has a diameter greater than an outer diameter of the optical fiber 78 at a portion on which the nylon coating 79 is provided. The optical fiber 78 is secured to the ferrule 74 by inserting the bare fiber 80 of the optical fiber 78 into the center bore 76 of the ferrule 74 and adhering a portion of the nylon coating 79 to the hole 77 of the ferrule 74. A cylindrical lens accommodating chamber 81 having an inner diameter a little greater than the diameter of a semi-spherical lens 82 is formed at an end portion of the ferrule 74 remote from the hole 77. The semi-spherical lens 82 is formed by polishing a spherical lens to a plane passing the center of the sphere of the spherical lens, and a reflecting film 83 is formed on the polished face of the semi-spherical lens 82. A hole 84 is formed at a lower portion of a side wall of the ferrule 74 defining the lens accommodating chamber 81 in an alined relationship with the photodetecting surface 72a of the PD chip 72.

A semi-spherical lens holding member 85 has an inclined face 85a which is inclined by an angle of 45 degrees with respect to the center axis of the semi-spherical lens holding member 85. The semi-spherical lens holding member 85 has an axially extending key way 86 formed on an outer cylindrical face thereof opposite to the inclined face 85a. Meanwhile, an axially extending key 87 is formed to project inwardly from a portion of the side wall of the ferrule 74 defining the lens accommodating chamber 81 opposite to the hole 74.

The semi-spherical lens 82 is mounted in position into the lens accommodating chamber 81 in the following manner. First, the semi-spherical lens 82 is inserted into the lens accommodating chamber 81 such that the cut or polished face thereof on which the reflecting face 83 is formed may be directed on the trailing side until the spherical face of the semi-spherical lens 82 is contacted with an end face of the bare fiber 80. Then, the semi-spherical lens holding member 85 is positioned such that the key 87 of the ferrule 74 may be fitted into the key way 86 thereof, and then, it is pushed into the lens accommodating chamber 81. After then, while the inclined face 85a of the semi-spherical lens holding member 85 is held in a closely contacting condition with the reflecting film 83 of the semi-spherical lens 82, an end face of the semi-spherical lens holding member 85 and an end face of the ferrule 74 are secured to each other by means of a bonding agent, soldering or laser welding. Since the inclined face 85a of the semi-spherical lens holding member 85 is held in a closely contacting condition with the reflecting face 83 formed on the cut face of the semi-spherical lens 82 and the key 87 is held in fitting engagement with the key way 86 in this manner, the semi-spherical lens 82 is held such that the cut face thereof is inclined accurately by an angle of 45 degrees with respect to the axis of the bare fiber 80 and the spherical face thereof is held in contact with the end face of the bare fiber 80. An upper end of the casing 70 is sealed in an airtight condition by a lid 88.

Thus, an optical signal which is transmitted by way of the optical fiber 78 is introduced into the semi-spherical lens 82 and is then totally reflected by the reflecting film 83 formed on the cut face of the semi-spherical lens 82 to change the direction thereof by an angle of 90 degrees while it is changed into a converging beam of light by the semi-spherical lens 82. The converging beam of light then passes through the hole 84 formed in the ferrule 74 and is focused upon the photodetecting surface 72a of the PD chip 72.

In the photo-semiconductor module of the embodiment described above, since signal light from the optical fiber is changed by an angle of 90 degrees in direction and is focused upon the PD chip mounted on the face of the ceramic substrate using the semi-spherical lens, a high optical coupling efficiency can be assured between the optical fiber and the PD chip similarly as in the photo-semiconductor module of the embodiment shown in FIG. 2. Further, since the ferrule in which the semi-spherical lens is built is securely mounted on the side wall of the casing, an adjusting operation to make the position of a focus of the semi-spherical lens coincide with the photodetecting surface of the PD chip can be performed readily.

While the photo-semiconductor devices of the embodiments described above are formed each as a photodetector module which employs a PD chip as a photo-semiconductor device, the present invention is not limited to such specific construction, and a photo-semiconductor of the present invention can be formed as a light emitting module which employs a laser diode of the plane light emitting type as a photo-semiconductor device.

What is claimed is:

1. A photo-semiconductor module, comprising:
    a casing having a bottom wall and a side wall which has an opening formed therein;
    a substrate carried on said bottom wall of said casing;
    a photo-semiconductor chip mounted on said substrate;
    a support member carried on said substrate and having an inclined face which is inclined by an angle of 45 degrees with respect to a surface of said substrate;
    a semi-spherical lens having a polished face passing the center of the sphere thereof and securely mounted at said polished face thereof on said inclined face of said support member above said photo-semiconductor chip;
    a glass member securely mounted on said side wall of said casing in such a manner as to close up said opening;
    a lid mounted on said casing for sealing the inside of said casing in an airtight condition; and
    an optical fiber mounted on said casing such that an end face thereof may be located in or in the neighborhood of said opening.

2. A photo-semiconductor module according to claim 1, wherein a plurality of electric parts are mounted on said substrate.

3. A photo-semiconductor module according to claim 1, wherein said photo-semiconductor chip is a photodiode.

4. A photo-semiconductor module, comprising:
    a casing having a bottom wall and a side wall which has an opening formed therein;
    a substrate carried on said bottom wall of said substrate;
    a photo-semiconductor chip mounted on said substrate;
    a glass rod inserted in said opening and secured to said side wall of said casing such that an end thereof may extend into the inside of said casing, said glass rod having at said end thereof an inclined face which is inclined by an angle of 45 degrees with respect to the center axis of said glass rod;
    a lid mounted on said casing for sealing the inside of said casing in an airtight condition; and
    a fiber assembly mounted on said side wall of said casing such that the optical axis thereof may substantially coincide with the center axis of said glass rod, said fiber assembly including a ferrule in and to which an optical fiber is inserted and secured and a cylindrical member in which said ferrule and a lens are accommodated in a predetermined positional relationship.

5. A photo-semiconductor module according to claim 4, wherein a plurality of electric parts are mounted on said substrate.

6. A photo-semiconductor module according to claim 4, wherein said photo-semiconductor chip is a photodiode.

7. A photo-semiconductor module, comprising:
    a casing having a bottom wall and a side wall which has an opening formed therein;
    a substrate carried on said bottom wall of said casing;
    a photo-semiconductor chip mounted on said substrate;
    a ferrule inserted in said opening and mounted on said side wall of said casing such that an end thereof may extend into the inside of said casing, said ferrule having a center bore, a lens accommodating chamber formed in a portion thereof adjacent said end contiguously to said center bore, and a hole formed at a lower portion of a side wall thereof which defines said lens accommodating chamber, said ferrule having an optical fiber inserted in and secured to said center bore thereof from the other end side;

a semi-spherical lens accommodated in said lens accommodating chamber; and holding means for holding said semiconductor lens such that a spherical face thereof contacts with an end face of said optical fiber and a polished face thereof which passes the center of the sphere of said semi-spherical lens makes an angle of 45 degrees with respect to said optical fiber.

8. A photo-semiconductor module according to claim 7, wherein said holding means includes a holding member having an outer diameter a little smaller than the inner diameter of said lens accommodating chamber and inserted in said lens accommodating chamber, said holding member having an inclined end face which is inclined by an angle of 45 degrees with respect to the center axis of said holding member and a key way formed on a cylindrical face thereof opposite to said inclined end face in such a manner as to extend in an axial direction of said holding member; and an axially extending key formed at a portion of said side wall of said ferrule opposite to said hole in such a manner as to project inwardly from said side wall.

9. A photo-semiconductor module according to claim 7, wherein a plurality of electric parts are mounted on said substrate.

10. A photo-semiconductor module according to claim 7, wherein said photo-semiconductor chip is a photodiode.

* * * * *

UNITED STATES PATENT AND TRADEMARK OFFICE
CERTIFICATE OF CORRECTION

PATENT NO. : 5,023,447

DATED : June 11, 1991

INVENTOR(S) : Masuko et al.

It is certified that error appears in the above-identified patent and that said Letters Patent is hereby corrected as shown below:

Col. 4, line 18, after "arm" insert --35--.
Col. 6, line 59, "alined" should be --aligned--.

Signed and Sealed this

Twenty-seventh Day of October, 1992

Attest:

DOUGLAS B. COMER

*Attesting Officer*  *Acting Commissioner of Patents and Trademarks*